United States Patent [19]
Kelsoe et al.

[11] Patent Number: 5,085,492
[45] Date of Patent: Feb. 4, 1992

[54] OPTICAL FIBER WITH ELECTRICAL ENCODING

[75] Inventors: Wayne E. Kelsoe, Saratoga; David M. Buzawa, San Jose, both of Calif.

[73] Assignee: Iris Medical Instruments, Inc., Mountain View, Calif.

[21] Appl. No.: 590,899

[22] Filed: Oct. 1, 1990

[51] Int. Cl.⁵ .............................................. G02B 6/32
[52] U.S. Cl. ..................................................... 385/60
[58] Field of Search ................ 350/96.20, 96.21, 96.23

[56] References Cited

U.S. PATENT DOCUMENTS

| | | | |
|---|---|---|---|
| 4,836,637 | 6/1989 | Poorman et al. | 350/96.21 |
| 4,842,363 | 6/1989 | Margolin et al. | 350/96.20 X |
| 4,887,875 | 12/1989 | Chang et al. | 350/96.21 |
| 4,964,690 | 10/1990 | Lappöhn et al. | 350/96.21 |

OTHER PUBLICATIONS

Augat Communications SMA-style connectors (product literature).
Philips encoded BNC connector (sketch).
Tektronix encoded BNC connector (sketch).

*Primary Examiner*—Frank Gonzalez
*Assistant Examiner*—Phan T. Heartney
*Attorney, Agent, or Firm*—Townsend and Townsend

[57] ABSTRACT

A fiber optic connector system. A first connector (25) associated with the fiber (15) includes a fiber holder (40) and a first engagement member. A second complementary connector (30) includes a fiber receptacle (95) and a second engagement member (90). The fiber holder is maintained in a precise position by the second connector when the first and second engagement members engage one another. The second connector may be associated with a radiation source. Associated with the first connector is a contact element (75) electrically coupled to the first engagement member through a network (80) for establishing a defined electrical characteristic therebetween. A second contact element (92, 103) associated with the second connector is normally insulated from the second engagement member and is mounted relative to the second engagement member so that the first and second contact elements make electrical contact with each other when the first and second engagement members are mechanically engaged with each other. Sensing circuitry (32) provides an electrical signal that represents the electrical characteristic between the second contact element and the second engagement member. Thus, when the first connector is engaged with the second connector, the signal represents the defined characteristic. Different type of fibers are provided with different values of this characteristic in the connector.

24 Claims, 3 Drawing Sheets

OPTICAL FIBER WITH ELECTRICAL ENCODING

BACKGROUND OF THE INVENTION

The present invention relates generally to optical fibers, and more specifically to techniques for determining the characteristics of an optical fiber that is coupled to a connector such as a connector on a radiation source.

Optical fibers have the desirable characteristic of being able to transmit light coupled into a first end of the fiber to a remote location at the second end of the fiber. Transmission is for most practical purposes substantially lossless, and the second end of the fiber can be moved about at will since the fiber is highly flexible. One example of a medical application is directing a laser's infrared radiation into the first end of an optical fiber, the second end which is inserted into a patient's eye, and causing the light emerging from the second end of the fiber to illuminate or deliver surgical energy for photocoagulation of a small area on the patient's retina.

The fiber is typically encased within a protective sheath and terminates at its first end in a connector. The connector, when it engages a complementarily configured connector on a fixed structure, holds the first end of the fiber at a defined location relative to the fixed structure. In this case, the fixed structure is the optical bench within a cabinet that houses a laser and suitable optics for coupling the laser output beam to the fiber.

One type of connector, referred to as an SMA-style connector, includes a ferrule and a cable nut rotatably mounted to the ferrule. The ferrule has an open end for insertion of a sheathed fiber, and a second end, closed except a precisely centered bore sized to accommodate the unsheathed end of the fiber. The fiber end is cemented into the ferrule. A complementary connector includes an externally threaded bushing sized to accommodate the ferrule and engage the cable nut.

SUMMARY OF THE INVENTION

The present invention provides a fiber connector system that allows a determination of whether a fiber is connected and the particular characteristics of the fiber and any permanently attached apparatus. With this information, control circuitry operates to prevent emission of radiation when no fiber is connected or to provide correct calibration factors and safety interlocks when it determines what kind of fiber is connected.

In brief, the present invention contemplates first and second connectors. The first connector is associated with the fiber and includes a fiber holder and a first engagement member. The second connector includes a fiber receptacle complementary with respect to the fiber holder and a second engagement member complementary to the first engagement member. The fiber holder is maintained in a precise position by the second connector when the first and second engagement members engage one another. The second connector may be associated with a radiation source, or may be part of a fiber to fiber connection.

Associated with the first connector is a contact element electrically coupled to the first engagement member through a network for establishing a defined electrical characteristic therebetween. A second contact element is associated with the second connector and is normally insulated from the second engagement member. The second contact element is mounted relative to the second engagement member so that the first and second contact elements make electrical contact with each other when the first and second engagement members are mechanically engaged with each other.

Associated with the second connector is sensing circuitry for providing an electrical signal that represents the electrical characteristic between the second contact element and the second engagement member. Thus, when the first connector is inserted into and engaged with second connector, the signal represents the defined characteristic.

Different types of fibers are provided with different values of this characteristic in the connector, so that a determination of this characteristic allows a unique determination of the fiber type. When no fiber is inserted into the second connector, the sensing circuitry senses an open circuit and, in the case where the second connector is associated with a radiation source, acts to suppress the emission of radiation. In a specific embodiment, the characteristic is electrical resistance.

In a preferred embodiment, the fiber holder and first engagement member are configured as an SMA-style male connector and the second connector is a threaded bushing sized to engage the SMA-style male connector. The contact element associated with the male connector is a cylindrical outer shell coaxial with the other portions of the SMA-style connector. The contact element associated with the female connector preferably includes a resilient contact that engages the cylindrical shell in the direction of axial insertion. An alternative arrangement provides a ring of resilient contacts surrounding the threaded bushing and located to engage the outer surface of the cylindrical shell.

A further understanding of the nature and advantages of the present invention may be realized by reference to the remaining portions of the specification and the drawings.

DESCRIPTION OF SPECIFIC EMBODIMENTS

Overview and Prior Art Connector

The present invention relates to an optical fiber connector system. The specific embodiment described in detail below has a first connector on a fiber and a second complementary connector associated with a laser source. However, the second connector need not be so associated. For example, it may be part of a fiber to fiber connection regime.

Figure 1:
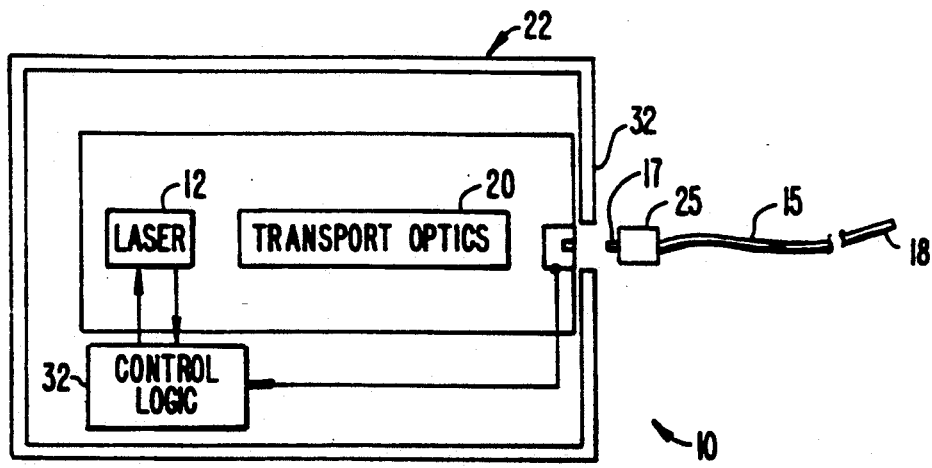
FIG. 1 is a simplified high level schematic view showing a radiation source and a detachable fiber.

FIG. 1 is a high level schematic view of a fiber optic based laser delivery system 10 in which the output radiation from a laser 12 is delivered into an optical fiber 15 having a proximal end 17 and a distal end 18. Laser 12 and suitable transport optics 20 are mounted to an optical bench 21 and housed in a cabinet 22. The proximal end of the fiber is mounted within a first connector 25, which mates with a second connector 30. Connector 30 is mounted to the optical bench inside cabinet 22 and is accessible through an aperture in a wall 32 of the cabinet. Provision is made for minute adjustments to register the connector relative to the laser and transport optics. The laser radiation is coupled into the fiber's proximal end by the transport optics (assuming the fiber end is properly registered relative to the laser and transport optics by the connectors), and emerges from distal end 18 as an output beam.

In a preferred embodiment, the transport optics includes a pair of lenses located such that the fiber end is at or near the exit pupil of the transport optics. In one embodiment, light from a laser diode source is imaged by a first lens, forming a magnified real image of the source at a convenient distance, the real image is reimaged by a second lens, and the fiber end is located at the exit pupil. The real image may be reimaged approximately at infinity in order to minimize the numerical aperture input to the fiber. However, departure from this condition may be useful to accommodate a wide range of fiber diameters.

Located within the cabinet is a control circuit 32 for operating the laser. As will be described below, connectors 25 and 30 cooperate to provide information relating to the presence of and characteristics of fiber 15. On the basis of this information, the control circuit provides various safety interlocks.

Figure 2:
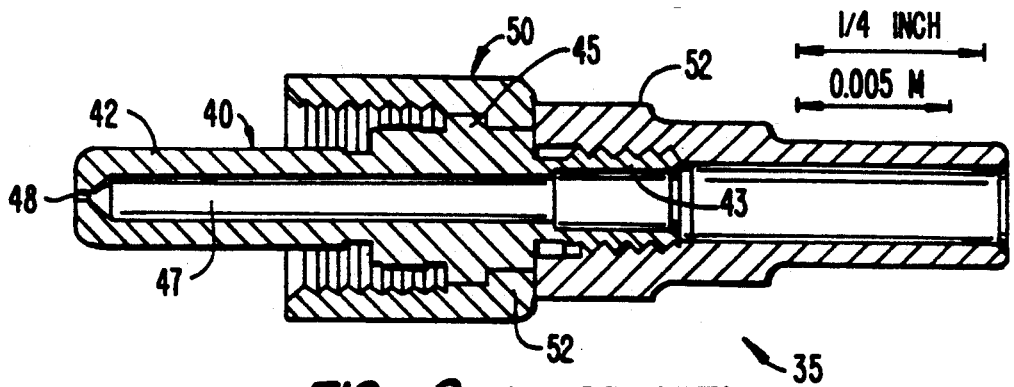
FIG. 2 is a cross-sectional view of a prior art male SMA-style connector.

FIG. 2 is a cross-sectional view of a typical prior art SMA-style male connector 35, such as a DSC Series connector available from Augat Communications Group, Seattle, Wash. The connector includes a ferrule 40 designed to hold the fiber. Ferrule 40 has a cylindrical portion 42 at a first end, an externally threaded portion 43 at a second end, and an intermediate flange 45. Cylindrical portion 42 is fabricated with a very precise outer diameter (0.1248 inches or 0.003170 meters in a specific embodiment). The ferrule is formed an inner bore 47 sized to accommodate a sheathed fiber. The first end of the ferrule is closed except for a very fine bore 48 of at most a few microns greater than the actual fiber diameter. A cable nut 50 having an inner diameter greater than the ferrule diameter is rotatably mounted to the ferrule. The cable nut has in inwardly extending flange 52 which is captured between flange 45 and a back post 52 which is threaded onto the ferrule at its first end.

Preferred Connector System

Figure 3:
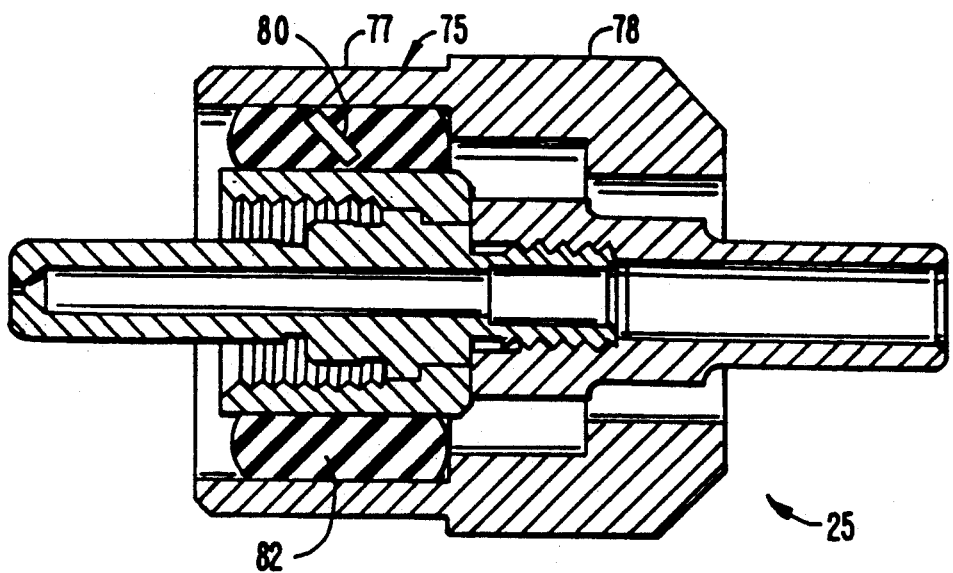
FIG. 3 is a cross-sectional view of a male connector modified according to the present invention.

FIG. 3 is a partially sectioned view of connector 25, which is a modified SMA-style connector. Reference numerals corresponding to those of FIG. 2 are used for corresponding portions of connector 25. In addition to the SMA-style connector described above, connector 25 includes an outer shell 75 surrounding cable nut 50 and portions of ferrule 40 and back post 52. A portion of the ferrule's cylindrical portion extends beyond the outer shell. The outer shell has smooth surface 77 over a first portion of its axial extent and a knurled surface 78 over a second portion of its axial extent.

A resistor 80 is electrically connected between cable nut 50 and outer shell 75 in the annular region between the two, and the annular region is filled with vinyl, silicone rubber, or other elastomeric insulator material 82. This serves to bond shell 75 to cable nut 50 so that the shell, resistor, and cable nut freely rotate relative to ferrule 40.

In a presently preferred embodiment, resistor 80 is a chip resistor and insulator material 82 is a segment of tubing. A small cut is made (preferably using a heated wire loop) in the tubing wall, the resistor is inserted, and the tube is placed inside shell 75. The shell (with tube and resistor) is then forced onto the SMA-style connector portion.

Figure 4A:
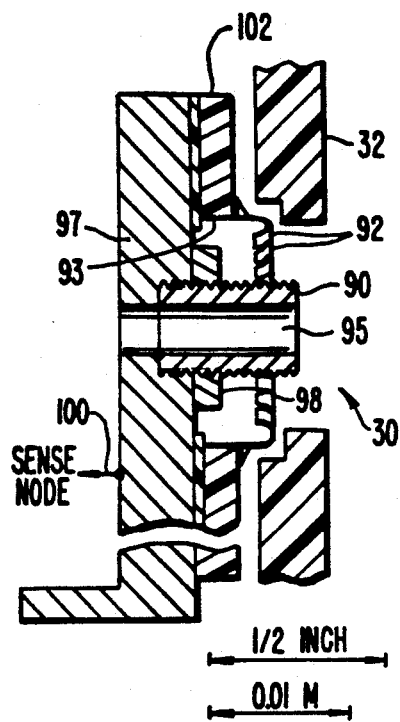
FIGS. 4A and 4B are cross-sectional and elevational views showing a female connector and contact assembly according to the present invention.
Figure 4B:
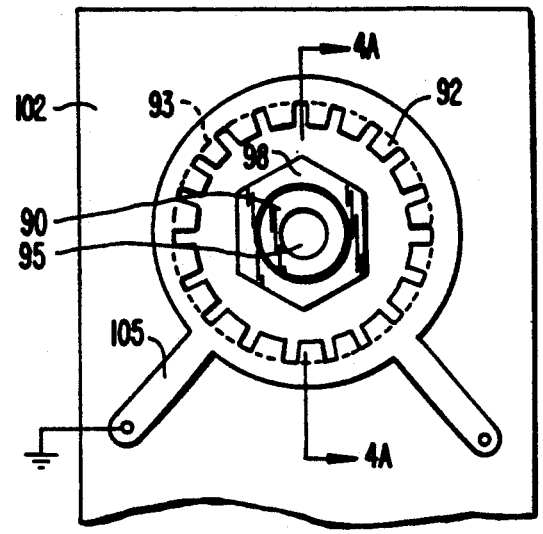

FIGS. 4A and 4B are cross-sectional and elevational views of connector 30 incorporating a first embodiment of a contact assembly. FIG. 4B shows the connector with the cabinet wall removed. In essence, connector 30 comprises a threaded bushing 90 and a ring of contacts 92 insulated therefrom. Bushing 90 has external threads that are complementary to the threads of cable nut 50, and is formed with a precisely honed bore 95 that provides a precise slip fit with cylindrical portion 42 of ferrule 40. Bushing 90 is threaded into a hole in a bracket 97 which is mounted to optical bench 21, and is locked in place by a nut 98. Bracket 97 (and bushing 90) define a sense node 100 for control circuit 32.

In the specific embodiment, there are 19 contacts made of phosphor bronze or other springy metal. Each contact is in the form of a generally u-shaped metal tab and the contacts are integrally formed on a carrier strip 93. The carrier strip is bent around in a cylindrical configuration, inserted in a circular aperture in a circuit board 102, and soldered to the circuit board so that the contacts intrude into the aperture. The contacts are disposed about a circle of a diameter that offers some resistance to insertion of the smooth surfaced portion of outer shell 75. The circuit board includes conductive portions 105 that allow the contacts to be connected to ground in control circuit 32.

Connector 25 engages connector 30 when ferrule 40 is inserted into bore 95 and cable nut 50 is threaded onto the outer threaded surface of bushing 90. Outer shell surface portion 77 is forced into the ring of contacts, and makes electrical contact therewith. The threadable engagement between the cable nut and the bushing provides electrical contact between one side of resistor 80 and bracket 97 (sense node 100) while the contact between outer shell 75 and contacts 92 causes the other side of resistor 80 to be grounded.

Figure 5A:
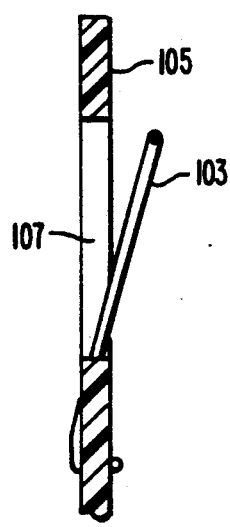
FIGS. 5A and 5B are cross-sectional and elevational views of an alternative contact assembly.
Figure 5B:
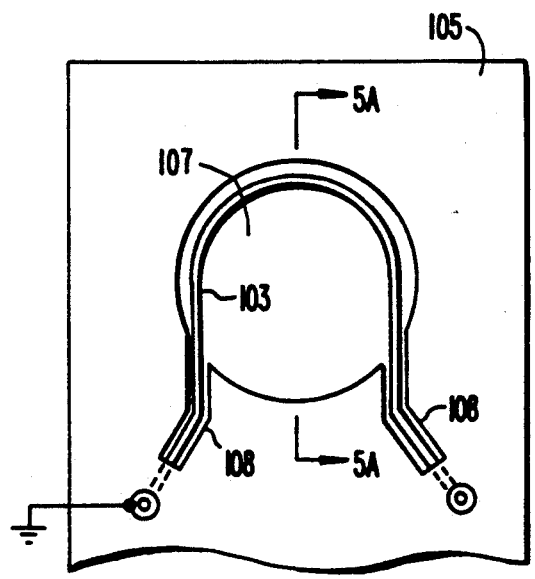

FIGS. 5A and 5B are cross-sectional and elevational views of a second (presently preferred) embodiment of the contact assembly corresponding to contact 92 and circuit board 102 of FIGS. 4A and 4B. Specifically, the contact assumes the form of a generally U-shaped wire 103 having its ends soldered to a circuit board 105. Wire 103 may be plated spring wire or the like, or can be formed of springy sheet material. The contact wire is bent out of plane of the circuit board through an aperture 107 and slots 108. Aperture 107 sized to freely accommodate the connector shell and wire 103 is configured to engage at least two points on the leading edge of the shell as the connectors engage each other.

Control System and Fiber Codes

Figure 6:
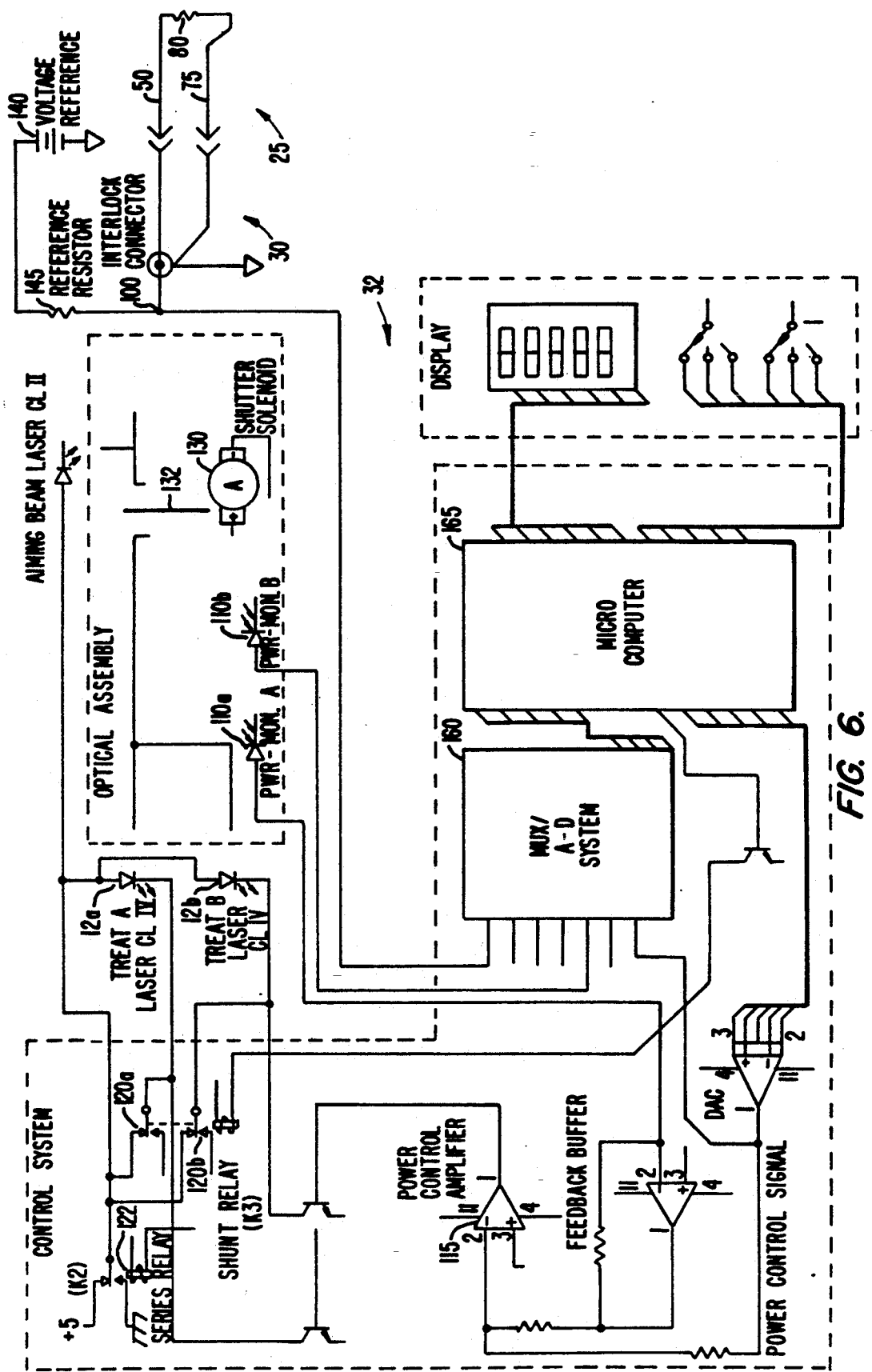
FIG. 6 is a block diagram of control circuitry according to the present invention.

FIG. 6 is a block diagram illustrating control circuit 32, which is responsible for controlling the operation of the laser. In the particular embodiment illustrated, there are actually a pair of lasers 12a and 12b whose beams are combined to provide the output beam.

In brief, the control system senses a signal representing the resistance of resistor 80, and signals from a pair of power monitors 110a and 110b representing the laser power output. The signals are used to control a power control amplifier 115, a number of relays 120a, 120b, and 122, and a shutter solenoid 130. The relays determine whether power is provided to lasers 12a and 12b; power control amplifier 115 determines the power level assuming that the relays are in a state to allow power to the lasers. Shutter solenoid 130 controls a shutter 132 and can thus prevent laser radiation from reaching the fiber connector, regardless of the level of output power and the state of the relays.

The resistance of resistor 80 is measured by a voltage divider comprising a voltage reference source 140 and a reference resistor 145, connected so that resistance 80 is part of a voltage division circuit that provides a voltage level at sense node 100. This voltage, along with the voltages from power monitors 110a and 110b is communicated to a multiplexed A/D converter system 160. These analog levels are digitized and provided to a microcomputer 165, which controls the relays, the shutter solenoid, and the power control amplifier.

The sensed value of resistor 80 provides critical information to microcomputer 165. An infinite resistance (open circuit) suggests the absence of a fiber, and would normally set the relays to prevent power from reaching the lasers, set the power amplifier to zero in case the relays failed, and close the solenoid in case all else failed. A value of zero resistance (short circuit) suggests an abnormal condition and results in the same redundant shutdown of the laser.

The significant cases are where the sensed resistance is an intermediate value, corresponding to a prearranged protocol. Table 1 shows a representative assignment of resistor values and applications where both the transmission efficiency and safety information are encoded. At present, only some codes are assigned. The system becomes more complex if fibers and laser sources are mixed. For example, a 600µ fiber and a 400µ fiber behave nearly identically with a 200µ laser diode source, but not with a 400µ source.

Conclusion

In conclusion it can be seen that the fiber coding scheme of the present invention is simple and effective, and provides the laser delivery system with critical information relating to the characteristics of the fiber connected to it. In addition, the coding scheme provides simple proof against common faults and failure modes by rejecting both opened and shorted circuits in a simple two contact systems.

While the above is a complete description of a specific embodiment of the present invention, modifications, alternative constructions, and equivalents may be used. For example, while the specific embodiment uses electrical resistance to characterize the fibers, other electrical characteristics could be used, as defined by other linear or non-linear networks connected between the cable nut and the outer shell. Possibilities include capacitors, inductors, and diode-resistor combinations. Therefore, the above description should not be taken as limiting the scope of the invention which is defined by the claims.

TABLE 1

RESISTOR TABLE FOR INTERNAL PULLUP FOR 2050 OHMS
2050 Ohms to plus supply

| CODE | RESISTANCE | ASSIGNMENT | FILTER INCLUDED? | TRANSMISSION |
|---|---|---|---|---|
| 100 | Open | No Fiber | N/A | N/A |
| 95 | 38950 | Not Used | N/A | N/A |
| 90 | 18450 | Delivery System 1 | N | High |
| 95 | 11617 | 2 | N | — |
| 80 | 8200 | 3 | N | — |
| 75 | 6150 | 4 | N | — |
| 70 | 4783 | 5 | N | — |
| 65 | 3807 | 6 | N | — |
| 60 | 3075 | 7 | N | — |
| 55 | 2506 | 8 | N | Low |
| 50 | 2050 | Not Used | | |
| 45 | 1677 | 9 | Y | High |
| 40 | 1367 | 10 | Y | — |
| 35 | 1104 | 11 | Y | — |
| 30 | 879 | 12 | Y | — |
| 25 | 683 | 13 | Y | — |
| 20 | 513 | 14 | Y | — |
| 15 | 362 | 15 | Y | — |
| 10 | 228 | 16 | Y | Low |
| 5 | 108 | Not Used | | |
| 0 | Short | Circuit Fault | | |

Present Code Assignment
75 - intraocular laser photocoagulator using 200µ fiber
45 - transcleral laser probe using 600µ fiber
20 - laser indirect ophthalmoscope using 200µ fiber and multi-element relay system

What is claimed is:

1. A fiber optic connector for use with a complementary connector, comprising:
   means for holding the end of an optical fiber;
   an engagement member, connected to the holding means, configured for positive mechanical and electrical engagement with an engagement portion of the complementary connector so as to maintain the holding means registered to the complementary connector;
   a contact element mechanically supported by the engagement member and configured for electrical engagement with a contact portion of the complementary connector; and
   means for establishing a defined value of an electrical characteristic between the engagement member and the contact element.

2. The connector of claim 1 wherein the electrical characteristic is resistance.

3. The connector of claim 1 wherein the holding means and first engagement member together define an SMA-style male connector.

4. The connector of claim 3 wherein the contact element comprises a conductive cylindrical shell coaxial with the engagement member.

5. A fiber optic connector for use with a complementary connector comprising:
- an SMA-style male connector portion including a ferrule for accommodating the end of an optical fiber and a cable nut rotatably mounted on said ferrule;
- a conductive, generally cylindrical shell portion sized to fit coaxially around the connector portion and radially spaced therefrom;
- means for mounting the shell portion coaxially to the connector portion without establishing direct electrical connection; and
- means for establishing a defined value of electrical resistance between the connector portion and the shell portion.

6. The connector of claim 5 wherein the means for mounting comprises a region of elastomeric material in the space between the connector portion and the shell portion.

7. The connector of claim 5 wherein the shell portion has an outer surface that includes a smooth portion and a textured portion.

8. In a fiber connector system wherein an end of a fiber is mounted in a first connector which includes a fiber holder and a first engagement member, and wherein a second connector includes a fiber receptacle having a configuration complementary to the fiber holder and a second engagement member having a configuration complementary to the first engagement member, the improvement comprising:
- a first contact element associated with the first connector;
- means for establishing a defined electrical characteristic between the first contact element and the first engagement member;
- a second contact element associated with the second connector, being normally insulated from the second engagement member;
- means for mounting the second contact element relative to the second engagement member so that the first and second contact elements make electrical contact with each other when the first and second engagement members are mechanically engaged with each other; and
- signal means, associated with the second connector, for providing an electrical signal representative of the electrical characteristic between the second contact element and the second engagement member;
- whereby the signal means operates to provide a signal representative of the electrical characteristic defined by the first connector when the first and second connectors are engaged with each other.

9. The improvement of claim 8 wherein the electrical characteristic is resistance.

10. The improvement of claim 8 wherein the fiber holder and first engagement member together define an SMA-style male connector.

11. The improvement of claim 10 wherein:
- the first contact element comprises a conductive cylindrical shell coaxial with the first engagement member; and
- the second contact element comprises a ring of resilient contacts coaxial with the second engagement element.

12. The improvement of claim 10 wherein:
- the first contact element comprises a conductive cylindrical shell coaxial with the first engagement member; and
- the second contact element comprises a resilient loop member surrounding a portion of the second engagement element.

13. In a radiation delivery system for coupling an optical fiber to a radiation source wherein an end of the fiber is mounted in a first connector which includes a fiber holder and a first engagement member, wherein the radiation source has an associated second connector for accepting the first connector, and wherein the second connector includes a fiber receptacle having a configuration complementary to the fiber holder and a second engagement member having a configuration complementary to the first engagement member, the improvement comprising:
- a first contact element associated with the first connector;
- means, associated with the first connector, for establishing a defined electrical characteristic between the first contact element and the first engagement member;
- a second contact element associated with the second connector, being normally insulated from the second engagement member;
- means, associated with the second connector, for mounting the second contact element relative to the second engagement member so that the first and second contact elements make electrical contact with each other when the first and second engagement members are mechanically engaged with each other;
- signal means, associated with the second connector, for providing an electrical signal representative of the electrical characteristic between the second contact element and the second engagement member so that the signal means operates to provide a signal representative of the electrical characteristic defined by the first connector when the first and second connectors are engaged with each other; and
- means, responsive to said signal means and coupled to the radiation source, for controlling the operation of the radiation source in a manner that depends on the value of the electrical characteristic.

14. The improvement of claim 13 wherein the electrical characteristic is resistance.

15. The improvement of claim 13 wherein the fiber holder and first engagement member together define an SMA-style male connector.

16. The improvement of claim 15 wherein:
- the first contact element comprises a conductive cylindrical shell coaxial with the first engagement member; and
- the second contact element comprises at least one resilient contact disposed to engage said shell.

17. The improvement of claim 16 wherein said second contact element comprises a ring of contacts coaxial with the second engagement element.

18. A fiber optic assembly for use with a complementary connector, comprising:
   an optical fiber having first and second ends and being characterized by a set of attributes;
   means for holding the first end of the optical fiber;
   an engagement member, connected to the holding means, configured for positive mechanical and electrical engagement with an engagement portion of the complementary connector so as to maintain the holding means registered to the complementary connector;
   a contact element mechanically supported by the engagement member and configured for electrical engagement with a contact portion of the complementary connector; and
   means for establishing a defined value of an electrical characteristic between said engagement member and said contact element, the electrical characteristic being defined to correspond, according to a predetermined protocol, to the set of attributes that characterize the fiber.

19. The fiber optic assembly of claim 18 wherein the electrical characteristic is resistance.

20. The fiber optic assembly of claim 18 wherein the holding means and first engagement member together define an SMA-style male connector.

21. The fiber optic assembly of claim 20 wherein the contact element comprises a conductive cylindrical shell coaxial with the engagement member.

22. A fiber optic assembly for use with a complementary connector comprising:
   an optical fiber having first and second ends;
   an SMA-style male connector portion including a ferrule for accommodating the first end of the optical fiber and a cable nut rotatably mounted on said ferrule;
   a conductive, generally cylindrical shell portion sized to fit coaxially around the connector portion and radially spaced therefrom;
   means for mounting the shell portion coaxially to the connector portion without establishing direct electrical connection; and
   means for establishing a defined value of electrical resistance between the connector portion and the shell portion, the electrical resistance being defined to correspond, according to a predetermined protocol, to the set of attributes that characterize the fiber.

23. The fiber optic assembly of claim 22 wherein the means for mounting comprises a region of elastomeric material in the space between the connector portion and the shell portion.

24. The fiber optic assembly of claim 22 wherein the shell portion has an outer surface that includes a smooth portion and a textured portion.

* * * * *